US007750288B2

(12) United States Patent
Grandjean et al.

(10) Patent No.: US 7,750,288 B2
(45) Date of Patent: Jul. 6, 2010

(54) METHOD OF MAKING AN OPTOELECTRONIC MODULE AND OPTOELECTRONIC MODULE OBTAINED BY SUCH METHOD

(75) Inventors: André Grandjean, Cressier (CH); Abdul-Hamid Kayal, Neuchâtel (CH)

(73) Assignee: EM Microelectronic-Marin S.A., Marin (CH)

( * ) Notice: Subject to any disclaimer, the term of this patent is extended or adjusted under 35 U.S.C. 154(b) by 371 days.

(21) Appl. No.: 11/960,269

(22) Filed: Dec. 19, 2007

(65) Prior Publication Data

US 2008/0142679 A1    Jun. 19, 2008

(30) Foreign Application Priority Data

Dec. 19, 2006   (EP)   ................................. 06126551

(51) Int. Cl.
*H01J 40/14*   (2006.01)
*G02B 27/00*   (2006.01)
*H01L 21/82*   (2006.01)

(52) U.S. Cl. ......................... 250/239; 250/551; 438/123

(58) Field of Classification Search ................. 250/239, 250/221, 551; 345/163, 165, 166; 257/99; 438/123

See application file for complete search history.

(56) References Cited

U.S. PATENT DOCUMENTS

| 4,188,708 | A |  | 2/1980 | Frederiksen |  |
| 4,369,440 | A |  | 1/1983 | Piguet et al. |  |
| 6,407,411 | B1 | * | 6/2002 | Wojnarowski et al. | ........ 257/99 |
| 2004/0084610 | A1 |  | 5/2004 | Leong et al. |  |
| 2004/0089872 | A1 | * | 5/2004 | Whitworth et al. | ............ 257/99 |

FOREIGN PATENT DOCUMENTS

| EP | 0 921 426 A1 | 6/1999 |
| EP | 1 339 012 A1 | 8/2003 |
| EP | 1 361 537 A1 | 11/2003 |
| EP | 1 577 742 A1 | 9/2005 |
| WO | 00/57352 | 9/2000 |

OTHER PUBLICATIONS

Foster, Eric M., "ESD Packaging Requirements for an Opto-Electronic Receiver Module," IEEE Transactions on Components Hybrids and Manufacturing Technology, Dec. 1990, vol. 13, No. 4, pp. 787-790.
European Search Report issued in corresponding application No. EP 06 12 6551, completed Jun. 14, 2007.

* cited by examiner

*Primary Examiner*—Thanh X Luu
(74) *Attorney, Agent, or Firm*—Griffin & Szipl, P.C.

(57) ABSTRACT

The method of making an optoelectronic module (10, 20), which includes a first light source circuit (5) and a second photoreceptor circuit (6) for picking up light from the first light source circuit reflected on an external surface. A first moulding (20) with an encapsulation material is made on one part of a lead frame (10) having several conductive paths (12) and an external frame (11) connecting all of the conductive paths. A first light source circuit (5) is placed on one portion of a first conductive path (13) of the lead frame that is not covered by the first moulding. A second photoreceptor circuit (6) is placed on one portion of a second conductive path (14) of the lead frame not covered by the first moulding. A through opening (21) is also made in the first moulding (20) between the external frame (11) and the location of the first light source circuit (5) to give access to the first connecting path (13) and to a third connecting path (15) for the first light source circuit. The contact pads of the first and second circuits (5, 6) are connected by metal wires (25) to corresponding uncovered pads of certain connecting paths (12) of the lead frame (10). The first and third connecting paths (13, 15) are then cut through the through opening (21) of the first moulding (20) in order to insulate electrically the first light source circuit (5) from the external parts. The light source circuit is thus protected from any electrostatic discharge. A second moulding can then be made on the first moulding (20) in order to close the through opening and obtain first and second apertures on the first and second circuits (5, 6) for the passage of light.

15 Claims, 5 Drawing Sheets

METHOD OF MAKING AN OPTOELECTRONIC MODULE AND OPTOELECTRONIC MODULE OBTAINED BY SUCH METHOD

This application claims priority from European Patent Application No. 06126551.8 filed 19.12.2006, the entire disclosure of which is incorporated herein by reference.

FIELD OF THE INVENTION

The invention concerns a method of making an optoelectronic module. Said optoelectronic module includes a first light source circuit and a second photoreceptor circuit able to pick up light coming from the first light source circuit directly or by reflection on an external surface. The finished optoelectronic module can thus be used for example in a computer mouse for moving a computer cursor.

The invention also concerns an optoelectronic module obtained in accordance with the method.

BACKGROUND OF THE INVENTION

For an application in a computer mouse, mounting a first light source circuit and a second photoreceptor circuit in the same optoelectronic module is already known. The first light source circuit generates light passing through a first aperture in the encapsulation material of the module, whereas the second photoreceptor circuit receives reflected light on an external surface through a second aperture in the encapsulation material. This photoreceptor circuit acting as a sensor generally includes several photosensitive zones for picking up light. The signals from this sensor are usually transmitted to another circuit for processing the sensor signals. Depending upon the quantity and the variation in the light picked up by certain photosensitive zones of the photoreceptor circuit, the processing circuit is able to provide control signals to the computer for moving a cursor on the computer screen.

EP Patent Application Nos. 1 339 012 and 1 361 537 and US Patent Application No. 2004/0084610, which disclose such an optoelectronic module, can be cited in this regard. This module thus includes, mounted on a lead frame, a first light source circuit, which is a light emitting diode, and a second photoreceptor circuit. A lens for each circuit is fixed in the encapsulation material in an aperture for each circuit, provided for such purpose. The light emitting diode generates light which passes through a first lens, whereas the photoreceptor circuit receives light reflected on an external surface by passing through a second lens.

In these patent applications, there is no description of the method of manufacturing the module while protecting the light source from any electrostatic discharge (ESD). A light source circuit of this kind can be destroyed when such discharges appear particularly by manipulating said module via external metal pins. Thus, it is often necessary to connect in more one transit diode to the light source circuit either inside said module, or outside, which is a drawback.

SUMMARY OF THE INVENTION

It is therefore a main object of the invention to provide a method of making an optoelectronic module, which overcomes the aforementioned drawbacks of the prior art, so as simply to protect the light source circuit from any electrostatic discharge that could occur when the module is manipulated, and without any additional components.

The invention therefore concerns a method of making an optoelectronic module, which includes the features mentioned in claim 1.

Particular advantageous steps of the method are defined in the dependent claims 2 to 11.

One advantage of the method of making the optoelectronic module is that at least two conductive paths, across which the first light source circuit is connected in the first moulding, are cut through the transverse or through opening of the first moulding. This completely insulates these two conductive paths connected to the light source circuit from the other parts of the lead frame, which may be accessible from outside the module. Thus, there is no conductive path leaving the first moulding that is directly connected to the light source circuit. This thus protects the light source circuit from any electrostatic discharge that may occur when the external conductive paths of the module are manipulated. The light source circuit is thus protected without mounting an additional transit diode, which reduces the manufacturing costs of the optoelectronic module.

The method of making the optoelectronic module also enables the electric power supply and drive to be uncoupled between the first light source circuit and the second photoreceptor circuit. In this manner, it is possible to devise a polyvalent sensor circuit with several electronic functions.

Another advantage of the method of making the optoelectronic module is that with the transverse or through opening in the first moulding providing access to two conductive paths of the lead frame, this facilitates any heating operation of the entire lead frame. By heating the lead frame via the two conductive paths, each circuit can easily be connected by metal wires to corresponding pads of the lead frame paths. Connection to the second photoreceptor circuit is achieved prior to connection of the first light source circuit, so as to protect any electrostatic discharge during this connection step.

Another advantage of this method of making the optoelectronic module is that a second moulding is carried out with an encapsulation material on the first moulding, leaving a first aperture above the first light source circuit and a second aperture above the second photoreceptor circuit. The first aperture defines a housing for placing a lens above the first light source circuit. Because of the second moulding, the through opening is closed, which makes the module more resistant to mechanical shocks.

Positioning holes may advantageously be made in the lead frame, the first moulding and the second moulding in order to facilitate all of the manufacturing steps of the optoelectronic module. At least two positioning holes remain at the end of the step of making the second moulding for mounting and positioning a transparent block on the apertures of the second moulding. The surface of the transparent block, which comes into contact with the second moulding, has a complementary shape to the external surface of the second moulding. In this manner, one lens-shaped portion of the transparent block moves into the first aperture of the second moulding, guided by two pins of the transparent block inserted in the two positioning holes.

Advantageously, the transparent block can be secured to the resin block of substantially parallelepiped shape, which is formed of the first and second mouldings using hooking means. For a transparent block made in colourless plastic, these hooking means can include hooked tabs arranged on two opposite sides in order to hook onto an opposite side of the resin block.

The invention therefore also concerns an optoelectronic module obtained via the method, which includes the features defined in claim 12.

Specific embodiments of the optoelectronic module are defined in the dependent claims 13 to 15.

BRIEF DESCRIPTION OF THE DRAWINGS

The objects, advantages and features of the method of making the optoelectronic module, and said module obtained via the method will appear more clearly in the following description of a non-limiting embodiment illustrated by the drawings, in which.

DETAILED DESCRIPTION OF THE INVENTION

In the following description, all of the parts of the optoelectronic module which are well known to those skilled in this technical field are related only in a simplified manner. Preferably, this optoelectronic module is made for use in a computer mouse, but one could envisage obtaining the module via the method for making the module according to the invention for use in another instrument or electric apparatus.

Figure 1:
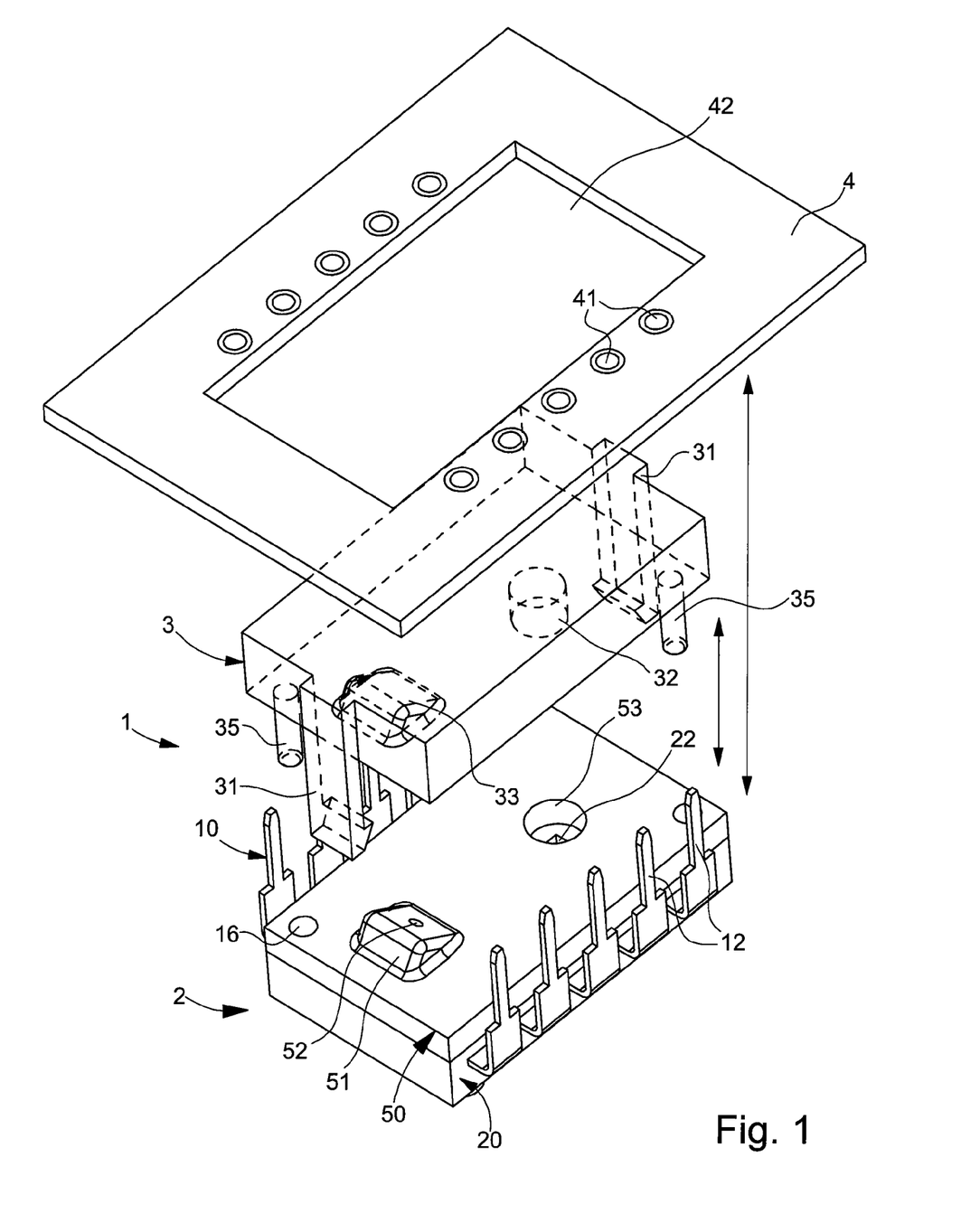
FIG. 1 shows an exploded three-dimensional view of an optoelectronic module according to the invention, to be secured to a printed circuit board.

FIG. 1 shows an exploded three-dimensional view of the optoelectronic module 1, which is obtained by the method of making the module according to the invention, to be secured to a printed circuit board 4. This optoelectronic module 1, 2 includes, encapsulated in a first moulding 20 and a second moulding 50, a first light source circuit and a second photoreceptor circuit, not shown in FIG. 1. A first aperture 22, 53 is made in the first and second mouldings, which are made using an encapsulation material, such as opaque resin, for the passage of the light generated by the first light source circuit. A second aperture 52 is made in a projecting part 51 of the second moulding for receiving light for the second photoreceptor circuit. This received light is essentially the light provided by the first light source circuit, which is reflected onto an external surface. This second aperture is shaped like a diaphragm. The second moulding 50 is thus made for covering an electronic processing zone for the signals of the second photoreceptor circuit, whereas an optoelectronic zone of the second photoreceptor circuit picks up the light reflected through the passage of the second aperture.

Parts of some conductive paths, for example made of metal, 12 of a lead frame 10 leave two opposite sides of first moulding 20 to form, after folding, connecting pins of optoelectronic module 1. The connecting pins are regularly spaced and in equal number on either side of the first moulding. At least some metal paths 12 are connected as explained below with reference to FIGS. 2A to 2G to the second photoreceptor circuit, since the first light source circuit is connected to two conductive paths of the frame that are not accessible from outside the module. In this manner, without adding any protective diode, the first light source circuit is insulated from the outside of the module, which protects said circuit from any electrostatic discharge (ESD) when the optoelectronic module is being manipulated.

Optoelectronic module 1 could be formed, under the reference 2, simply by the opaque resin block of generally parallelepiped shape formed by the first and second mouldings 20, 50 first and second circuits and connecting pins 12 of lead frame 10. This optoelectronic module could thus be made in the form of an electronic component with connecting pins of the standard DIP type, with the two apertures located underneath said module. However, this module could also include a transparent block 3 placed on the first and second apertures 53, 52 of the second moulding. This transparent block, which thus closes the two apertures 53, 52, could also protect the first and second circuits from dust and environmental conditions.

Transparent block 3 could be made of glass or preferably plastic. The surface of the transparent block, which comes into contact on second moulding 50, could be of complementary shape to the external bottom surface of the second moulding. Thus, one lens-shaped portion 32 of the transparent block could be housed in the cylindrical housing 53 of the first aperture of the second moulding 50. Moreover, a complementary portion 33 of the transparent block covers the projecting part 51 of the second moulding and the second light reception aperture 52.

In order to facilitate the positioning of this transparent block on the second moulding, at least two positioning holes 16 are provided, made in two opposite corners of the first and second mouldings 20, 50, and in lead frame 10, as explained below. Transparent block 3 thus includes two pins 35 whose diameter is less than or equal to the diameter of the positioning holes in order to be guided into the two holes when the transparent block is mounted on the opaque resin block 20, 50. The free ends of these pins 35 could be rounded or chamfered to facilitate the introduction thereof into the two positioning holes 16.

Transparent block 3 can be fixed to second moulding 50 with adhesive or via hooking means 31. These hooking means may preferably be two hooked tabs 31 integral with the transparent block and extending in a vertical direction relative to optoelectronic module 2. The two tabs are arranged on two opposite sides of the transparent block so as to come into contact on two faces of the module without connecting pins 12. These tabs 31 have each a hook at a free end. The hooks are each formed with an inclined plane in order to bend each tab when the transparent block is fixed to the second moulding. These hooks eventually hook onto a top face of the optoelectronic module resin block 2.

Optoelectronic module 1, which includes resin block 2 and transparent block 3 fixed to the opaque resin block, can be mounted on a printed circuit board 4. Connecting pins 12 can be inserted and welded in metallised holes 41 of printed circuit board 4. An aperture 42 of printed circuit board 4 is also provided whose dimensions are sufficient to allow the transmission of light from the first light source circuit and the reception of reflected light for the second photoreceptor circuit.

The method of making the optoelectronic circuit is explained below with reference to FIGS. 2A to 2G.

Figure 2A:
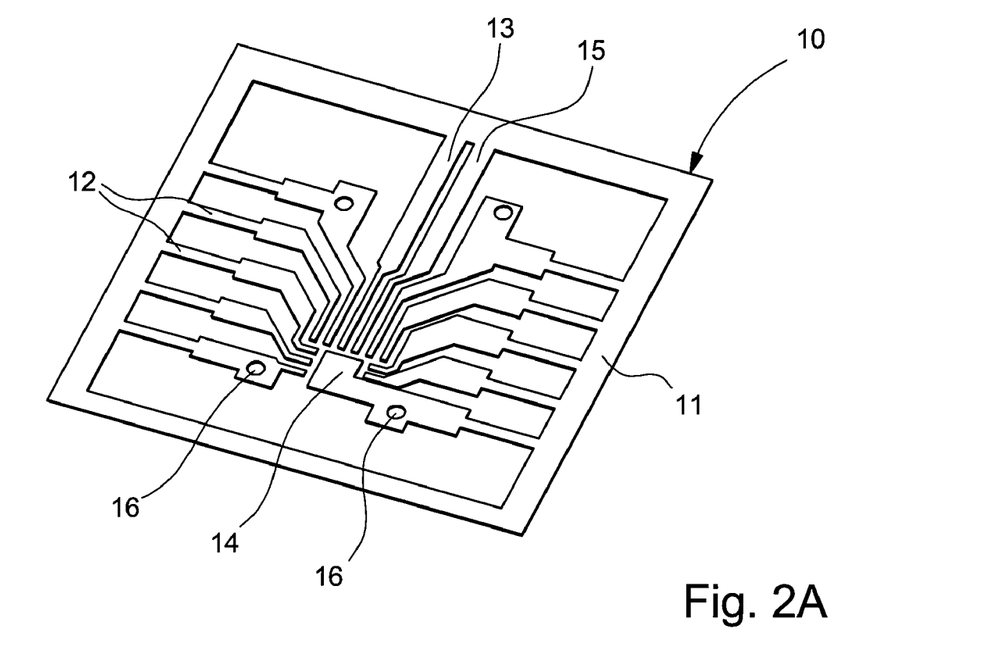
FIGS. 2A to 2G show three dimensional views of the components of the optoelectronic module in the successive steps of the method of making said optoelectronic module according to the invention.

First of all, a lead frame of generally plane shape is formed, as shown in FIG. 2A. This lead frame 10 is preferably made using sheet metal or a metal film whose thickness if less than or equal to 1 mm, and whose length and width are each less than 3 cm. Of course, one could also envisage making the lead frame by means of a conductive substrate secured to an insulating substrate. Moreover, one could also envisage a strip of several lead frames for simultaneously mounting several optoelectronic modules.

In the embodiment of FIG. 2A, this lead frame includes a certain number of conductive paths 12, for example metal paths. Only one end of all of the metal connecting paths is connected to a connecting bar or preferably to several connecting bars 11 forming an external frame. A first metal path 13 includes one portion on which the first light source circuit can be mounted. This portion is preferably situated in the middle of metal path 13 as explained below with reference to FIG. 2C. A third metal path 15 arranged parallel to the first metal path 13 is provided for connection to a contact pad of the first light source circuit. A second metal path 14 includes one portion at the free end thereof on which the second photoreceptor circuit is mounted. This portion is situated in a central area of the lead frame 10 in proximity to the free ends of the first and third metal paths 13 and 15.

An equal, regularly spaced, number of metal connecting paths 12 is connected between two opposite sides of metal frame 11 of lead frame 10, to define, at the end of the process, conductive connecting pins of the optoelectronic module. However, the first and third metal paths 13 and 15 are connected in a perpendicular direction to the other metal paths on one side of the metal frame connecting the two opposite sides.

The lead frame also includes several positioning holes 16 preferably a number equal to four, which are each made in a metal connecting path. Preferably, these four positioning holes 16 are made perpendicular to the plane of lead frame 10 in the first and last metal paths connected to the two opposite sides of metal frame 11. These positioning holes are used for facilitating visually and/or mechanically the various operations for making the optoelectronic module. They are preferably situated in a central area of the lead frame on which the first and second mouldings, explained above, are made.

Figure 2B:
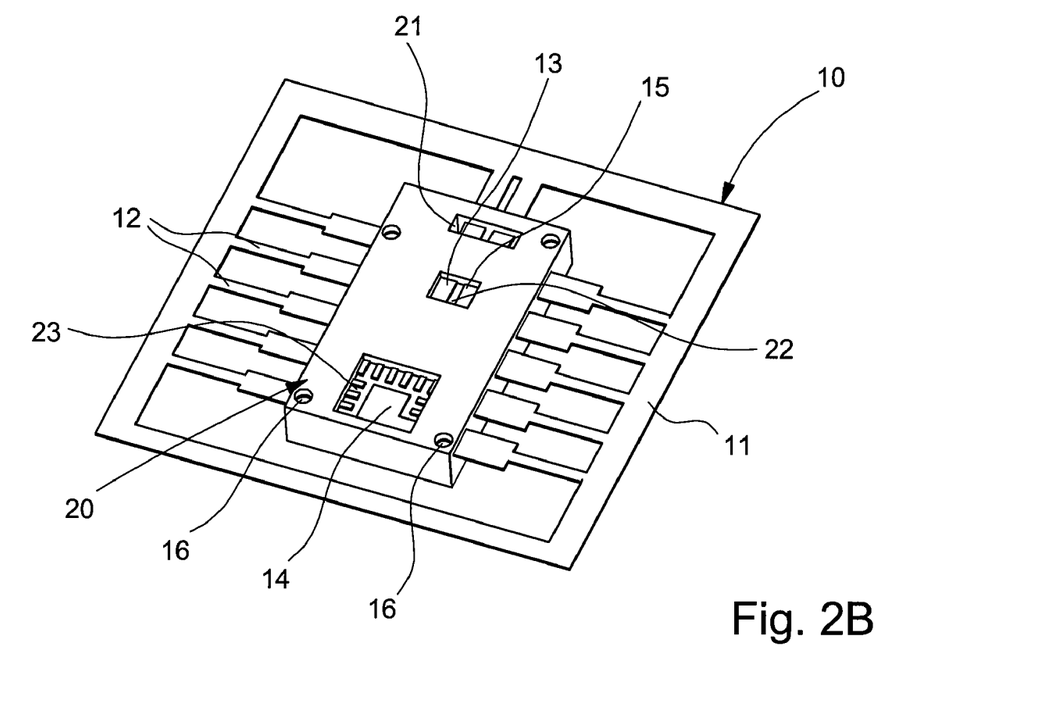

FIG. 2B shows a first moulding 20 with an encapsulation material, such as conventional opaque plastic resin, which is made on one part of lead frame 10 by the method of making the optoelectronic module according to the invention. This first moulding can be obtained by means of a cast in two parts. A first part of the cast is arranged under lead frame 10 in a central position, whereas a second part of the cast is arranged on the frame above the first part of the cast. The two parts of the cast, not shown, are held on each other by means of pins passing through the four positioning holes 16. Opaque plastic resin paste is injected into and solidified in the cast in order to produce on one part of lead frame 10 a first moulding 20 forming a first resin block of generally parallelepiped external shape. This first moulding 20 does not, in principle, close positioning holes 16.

This first moulding 20 completely covers at least one intermediate part of metal paths 12 of lead frame 10 while leaving first and second uncovered rectangular areas 22, 23 on one face of the lead frame. One intermediate area of the first and third metal paths 13, 15 is thus uncovered on one side of lead frame 10 in the first area 22 in order to allow the first light source to be placed and connected therein. The free ends of the second metal path 14 and the other metal paths 12 are uncovered on the same side of the lead frame in second area 23 in order to allow the second photoreceptor circuit to be placed and connected therein.

The first moulding 20 further includes a through opening 21 of rectangular shape situated between frame 11 of the lead frame and the first uncovered area 22 to allow access to the first and third metal paths 13 and 15. This through opening is necessary to perform certain intermediate steps of the method of making the module according to the invention.

Figure 2C:
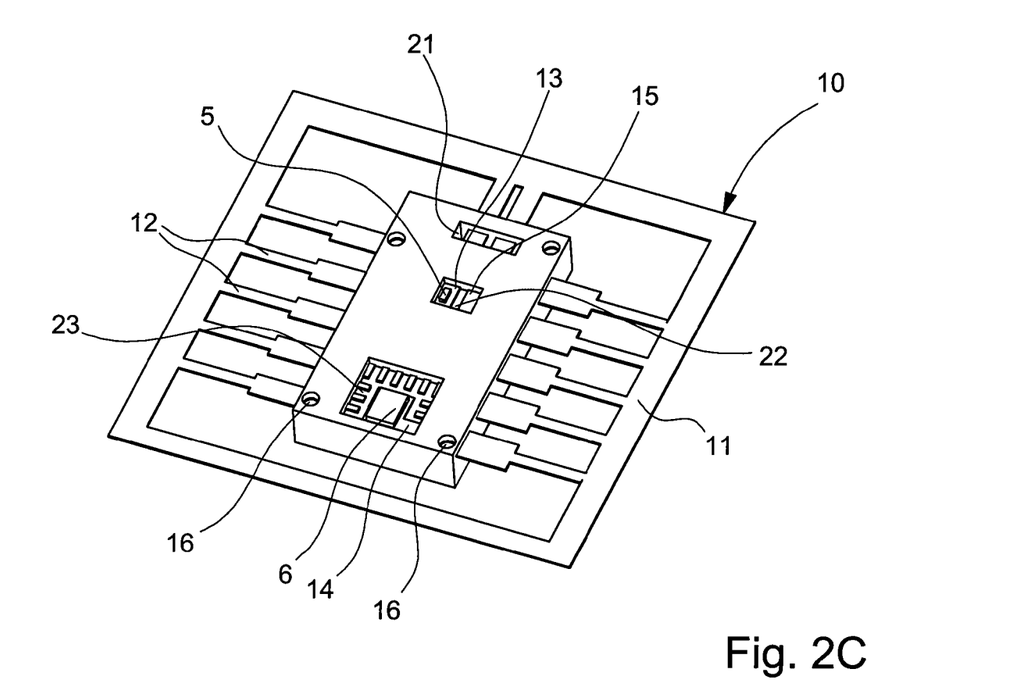

Once the first moulding 20 has been made on a central part of the lead frame, the first integrated light source circuit 5 is secured on the back side using a conductive adhesive on the first metal path 13 in first area 22, as shown in FIG. 2C. The first light source circuit is preferably a laser diode. The second integrated photoreceptor circuit 6 is secured on the back side using a conductive adhesive on an end portion of the second metal path 14. This second integrated photoreceptor circuit 6 is advantageously made in a silicon semiconductor substrate. It includes an optoelectronic zone having several conventional photosensitive portions for picking up the reflected light from the laser diode, and an electronic processing zone for the signals from the photosensitive portions of the optoelectronic zone.

Figure 2D:
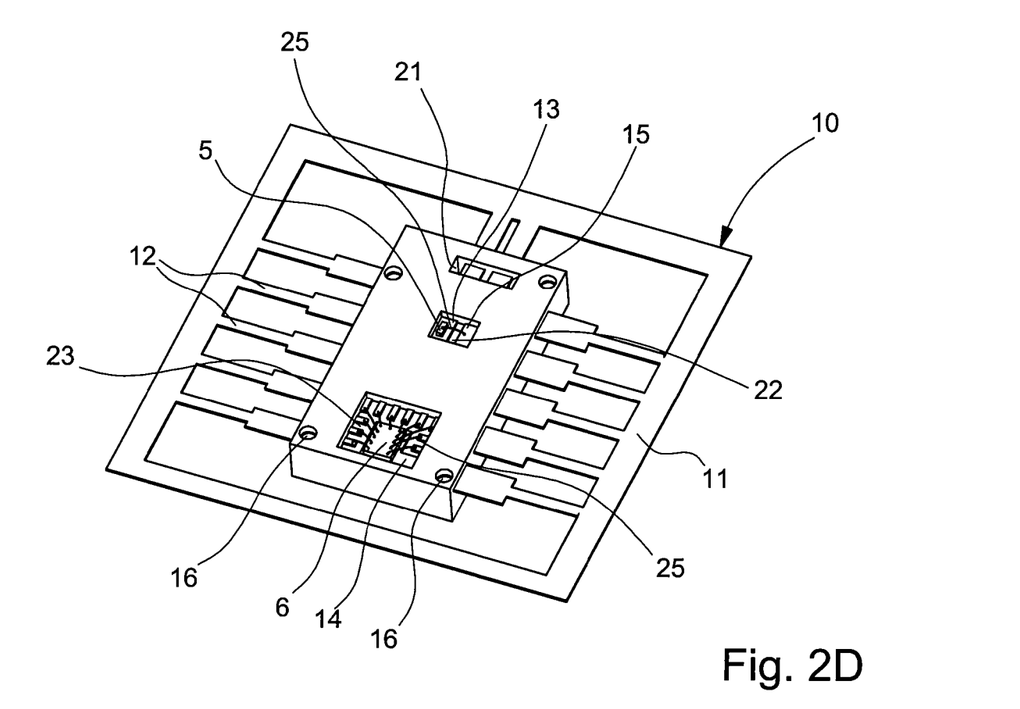

As shown in FIG. 2D, contact pads of the second photoreceptor circuit 6 are first of all connected by metal connecting wires 25 to corresponding pads of the lead frame, which are situated at the free ends of at least some of the metal paths 12. The connection of this second photoreceptor circuit is preferably achieved with metal wires made of aluminium. Owing to transverse or through opening 21 made in first moulding 20, it is possible to heat lead frame 10 on the first and third metal paths 13 and 15 through the through opening in order to connect the second photoreceptor circuit easily via metal wires.

A contact pad on the top of the first light source circuit 5, which is preferably a laser diode, is connected by a metal wire in first uncovered area 22 to the third metal path 15. The metal wire is preferably a gold wire. Just as for the second photoreceptor 6, the first and third metal paths 13, are advantageously heated by a temperature sensor through the through opening for the operation of electrically connecting the first light source circuit 5. The first light source circuit 5 is connected via first and third metal paths 13, 15 to contact pads of the second photoreceptor circuit 6, which includes protective diodes for the first light source circuit 5.

Figure 2E:
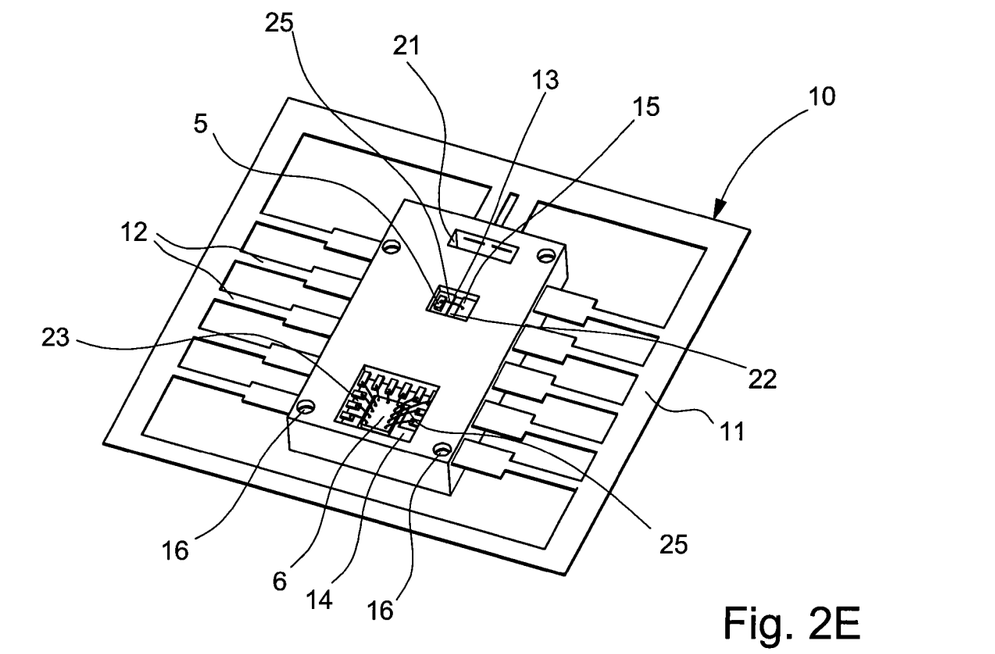

After the operation of electrically connecting the first and second integrated circuits, the first and third metal paths 13, 15 are advantageously cut through the through opening aperture 21 as shown in FIG. 2E. The first and third metal paths 13, 15 connecting the first light source circuit 5 are thus no longer electrically connected to the other parts of lead frame 10. In this manner, first light source circuit 5 is electrically insulated from the parts of the lead frame accessible from outside first moulding 20. This consequently protects the first light source circuit 5 from electrostatic discharge without having to mount an additional overvoltage protective diode. Protective diodes are provided solely in the second photoreceptor circuit to protect the very sensitive first light source circuit from any electrostatic discharge (ESD).

It should also be noted that by cutting the first and second metal paths 13, 15 through transverse opening 21 made in first moulding 20, this also prevents direct access to the cut parts of the paths. These metal paths 13, 15 can be cut for example using a laser beam.

Figure 2F:
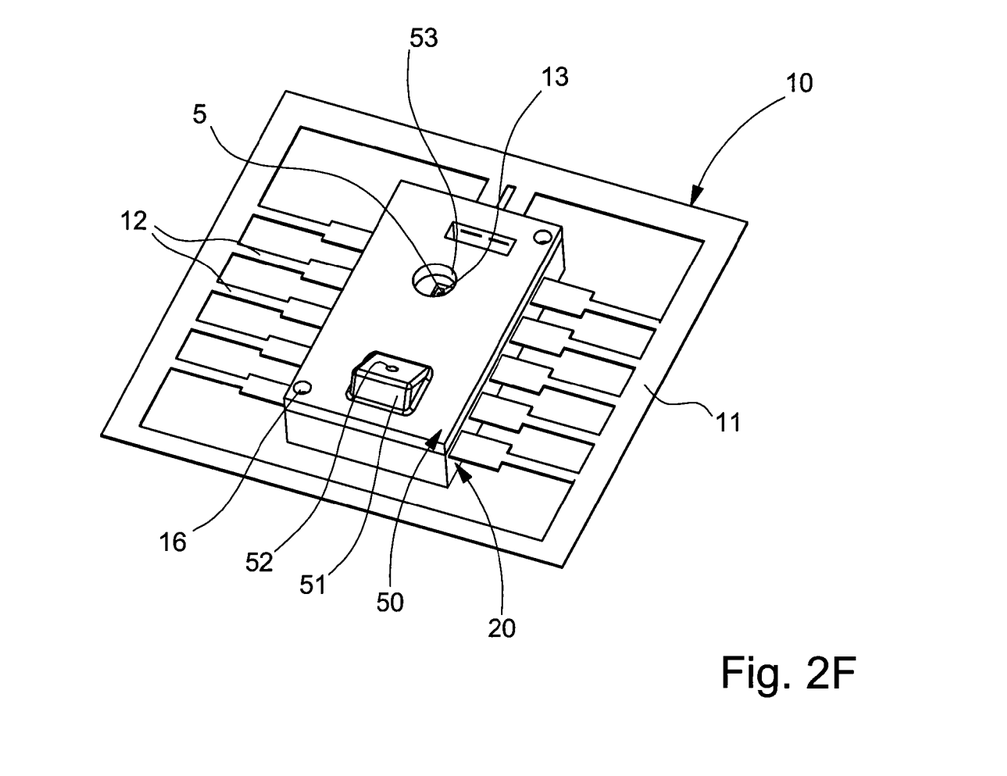

After having cut the first and third metal paths through the through opening, a second moulding 50 with an encapsulation material is made on one face of first moulding 20 as shown in FIG. 2F. The encapsulation material of the second moulding 50 could be formed of the same plastic resin as that used for first moulding 20. Second moulding 50 forms an opaque resin block of generally substantially parallelepiped shape with the first moulding.

With second moulding 50, the through opening is totally closed, as are closed two of the four positioning holes 16, which makes the module more resistant to mechanical shocks. The two unclosed holes in proximity to two diametrically opposite corners are holes of circular section arranged in a perpendicular direction to lead frame 10.

Once made on first moulding 20, the second moulding 50 includes a first aperture 53 above the first light source circuit 5. This first circular aperture 53 defines with the first moulding a housing for an optical lens. The dimension of the diameter of this first aperture is preferably larger than the first light source circuit in order to leave a large angle of aperture for the light produced by the first light source circuit 5.

A second aperture 52 for receiving light for the second photoreceptor circuit is made in a projecting part 51 of the second opaque moulding 50. This second aperture in the form of a diaphragm forms a passage for the light reflected on an external surface and produced by the first light source circuit 5. The second moulding 50 is also made for covering only one electronic processing zone for signals of the second photoreceptor circuit, leaving an uncovered optoelectronic zone for picking up light through the second aperture 52.

Figure 2G:
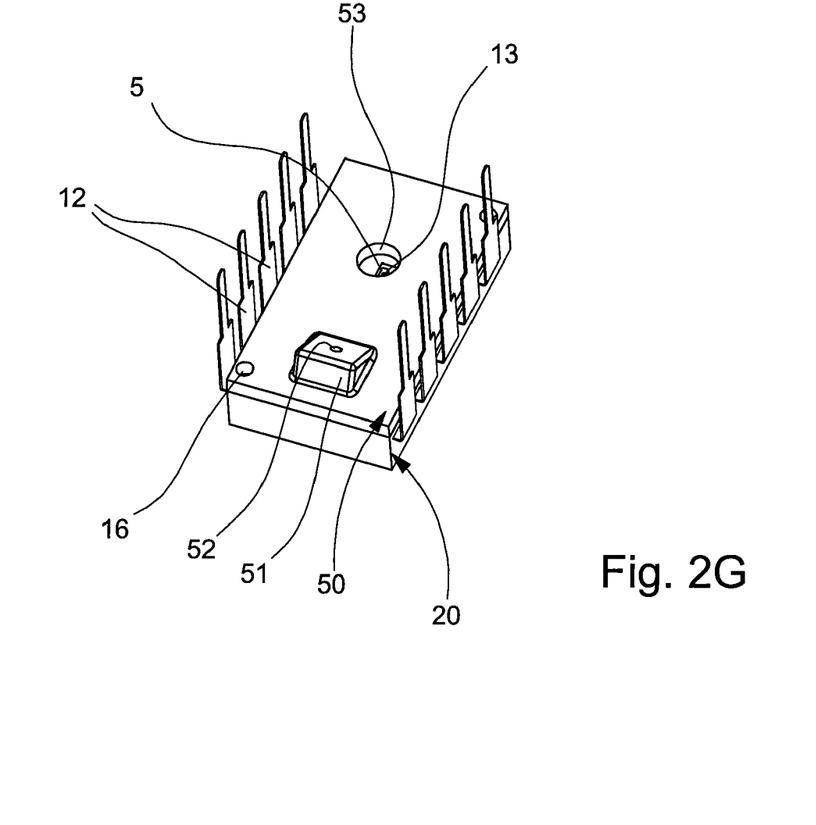

In FIG. 2G, optoelectronic module 2 is shown once all of the encapsulation operations of the first and second integrated circuits have finished. The frame of the lead frame is cut and the metal paths 12 on the two opposite sides of first moulding 20 are folded on the side of the first and second apertures 52, 53 of second moulding 50. The folded metal paths 12 thus form the electric connecting pins of optoelectronic module 2. The residual parts of the first and third metal paths are also cut flush with the side of the module connecting the two opposites sides having the connecting pins. This finished optoelectronic module 2 can also be completed by mounting a transparent optical lens block guided and positioned by the two positioning holes 16 as described with reference to FIG. 1.

Figure 3:
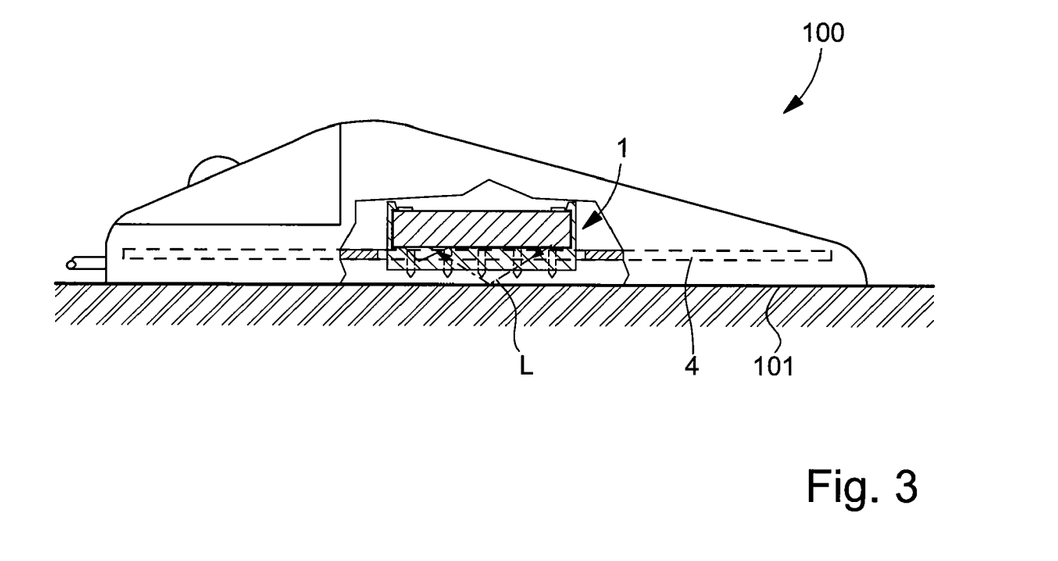
FIG. 3 shows a simplified side view of a partial cross-section of a computer mouse, which includes the optoelectronic module according to the invention, on a work surface.

The complete optoelectronic module 1 can thus be fitted to a computer mouse 100 as shown in a simplified manner in FIG. 3. The optoelectronic module is mounted on a printed circuit board 4, which includes an aperture underneath the module for the passage of light L. The light is generated by the first light source circuit, which is preferably a laser diode. This light passes through the first aperture of the module and a lens of the transparent block fixed to the bottom of the module. This light L is reflected on a work surface 101 of computer mouse 100 and received by several photosensitive portions of the second photoreceptor circuit through the transparent block and the second aperture of the module. The signals processed by the second photoreceptor circuit are transmitted to a computer station in a conventional manner, particularly for controlling the movement of a cursor on the screen.

From the description that has been given, those skilled in the art can devise multiple variants of the method of making an optoelectronic module, and the module obtained, without departing from the scope of the invention defined by the claims. One could envisage an optoelectronic module with connecting pins that come out of only one side of the resin block, which could take a different form from a generally parallelepiped shape. All of the conductive paths of the lead frame could consequently be connected only to one external connecting bar. One could also envisage mounting a lens on the second aperture of the module for receiving light or having only one lens fixed directly in the housing of the first aperture of the second moulding.

What is claimed is:

1. A method of making an optoelectronic module, which includes a first light source circuit and a second photoreceptor circuit able to pick up the light from the first light source circuit directly or by reflection onto an external surface, wherein the method includes the steps of:
    making a first moulding with an encapsulation material on a lead frame on which there are placed, prior to or after the first moulding and over at least one part of one face of the lead frame that is not covered by the first moulding, the first light source circuit on one portion of a first conductive path of the lead frame and the second photoreceptor circuit on one portion of a second conductive path of the lead frame, the first and second conductive connecting paths, and other conductive connecting paths of the lead frame being connected outside the first moulding to at least one connecting bar, a through opening being made in the first moulding between the connecting bar and the location of the first light source circuit in order to give access to the first conductive path and to a third conductive connecting path for the first light source circuit,
    electrically connecting contact pads of the first and second circuits to corresponding uncovered pads of some conductive paths of the lead frame, the first light source circuit being connected via the first and third conductive paths to contact pads of the second photoreceptor circuit, and
    cutting the first and third conductive connecting paths through the through opening of the first moulding in order to electrically insulate the first light source circuit from the parts of the lead frame accessible outside the first moulding, said first light source circuit being connected to the exterior only via the second photoreceptor circuit, in order to protect the light source circuit from electrostatic discharge.

2. The method according to claim 1, wherein a second moulding with an encapsulation material is made on the first moulding so as to close the through opening after the first and third conductive paths have been cut and to form a first aperture on the first light source circuit for the passage of the light generated by said first circuit, and a second aperture for receiving light on the second photoreceptor circuit.

3. The method according to claim 2, wherein the second aperture is made in a projecting part of the second opaque moulding to form a light passage in the shape of a diaphragm, and wherein the second moulding is made for covering an electronic processing zone for the signals of the second photoreceptor circuit, whereas an optoelectronic zone of the second photoreceptor circuit is for picking up light through the light passage of the second moulding.

4. The method according to claim 1, wherein the first opaque moulding is made as a resin block of generally substantially parallelepiped shape on a central part of the lead frame, which includes several bars forming a connecting frame for the metal conductive paths, outside the first moulding, an equal number of regularly spaced metal conductive paths coming out of two opposite sides of the resin block of the first moulding, whereas the first and third metal conductive paths for the first light source circuit come out of a third side of said resin block.

5. The method according to claim 2, wherein the second opaque moulding is made on the first opaque moulding on the side of the lead frame carrying the first and second circuits, to form with the first moulding a resin block of generally substantially parallelepiped shape, and wherein the second moulding is made on the first moulding with a first aperture for the passage of the light generated by said first circuit, which defines with the first moulding a housing for an optical lens, said first aperture being of larger dimensions than the first light source circuit, and a second aperture for receiving light on the second photoreceptor circuit.

6. The method according to claim 1, wherein the first opaque moulding is made on the lead frame using positioning holes in conductive connecting paths of the lead frame, said positioning holes, whose number is preferably equal to four, not being closed by the first moulding and located in a perpendicular direction to the lead frame in proximity to the corners of the block of the first moulding once made.

7. The method according to claim 6, wherein the second opaque moulding is made on the first opaque moulding without closing two positioning holes located at two opposite corners of a resin block once made, which is formed by the first and second mouldings, wherein the connecting bar or connecting frame of the lead frame are cut and wherein the metal conductive paths coming out of two opposite sides of the resin block are folded over to form electrical connecting pins for the optoelectronic module.

8. The method according to claim 1, wherein after the first moulding has been made on the lead frame, the first and second circuits are secured respectively on one portion of the first and second metal conductive paths, and wherein contact pads of the first and second circuits are connected by metal connecting wires to corresponding pads of the lead frame by heating the lead frame, achieved by heating the first and third metal conductive paths through the through opening.

9. The method according to claim 2, wherein a block of transparent material, which includes at least one lens for the first light source circuit, is made in order to be mounted on the first and second apertures of the second moulding, the part of the transparent block coming into contact with the second moulding having a complementary shape to one external surface of the second moulding such that one lens shaped portion of the transparent block is housed in the first aperture of the second moulding.

10. The method according to claim 9, wherein the transparent block is made of glass or plastic material, wherein the transparent block is made with two positioning pins in order to be mounted and positioned on the second moulding via two positioning holes made through a resin block formed by the first and second mouldings, and the lead frame.

11. The method according to claim 10, wherein the transparent block is fixed to the resin block mechanically by hooking means integral with the transparent block or bonded to the resin block.

12. The optoelectronic module obtained by the method according to claim 1, said module including, mounted on one side of a lead frame only a first light source circuit placed on one portion of a first conductive path of the lead frame, and a second photoreceptor circuit placed on one portion of a second conductive path of the lead frame, contact pads of the first and second circuits being connected by metal wires to corresponding uncovered pads of some conductive paths of the lead frame, said first light source circuit being connected via the first conductive path and a third conductive path to contact pads of the second photoreceptor circuit, wherein the module includes at least a first moulding made with an encapsulation material on a central part of the lead frame, and a certain number of conductive connecting paths coming out of the first moulding, the first light source circuit only being connected to the outside via the second photoreceptor circuit in order to protect said light source circuit from electrostatic discharge.

13. The optoelectronic module according to claim 12, wherein it includes a second moulding made with an encapsulation material on the first moulding on the side of the lead frame carrying the first and second circuits, to form with the first moulding a resin block of generally substantially parallelepiped shape, wherein the second moulding is made on the first moulding with a first aperture for the passage of the light generated by said first circuit, which defines with the first moulding a housing for an optical lens, said first aperture being of larger dimensions than the first light source circuit, and a second aperture for receiving light on the second photoreceptor circuit, said second aperture being made in a projecting portion of the second opaque moulding to form a light passage in the shape of a diaphragm, and wherein the second moulding is made for covering an electronic processing zone for the signals of the second photoreceptor circuit, whereas an optoelectronic zone of the second photoreceptor circuit is for picking up light through the light passage of the second moulding.

14. The optoelectronic module according to claim 13, wherein the module further includes a block of transparent material mounted on the first and second apertures of the second moulding, the part of the transparent block that comes into contact with the second moulding having a complementary shape to one external surface of the second moulding such that one lens shaped portion of the transparent block is housed in the first aperture of the second moulding for the first light source circuit, which is preferably a laser diode.

15. The optoelectronic module according to claim 14, wherein the transparent block is made of glass or plastic material, wherein the transparent block includes two positioning pins inserted in two positioning holes made in the resin block formed by the first and second mouldings, and wherein the transparent block includes, on two opposite sides, hooking means in the form of hooked tabs for hooking onto one face of said resin block opposite to the contact face of the transparent block on the second moulding.

* * * * *